United States Patent [19]

Pantelis

[11] Patent Number: 4,557,880
[45] Date of Patent: Dec. 10, 1985

[54] PIEZOELECTRIC AND PYROELECTRIC FILM

[75] Inventor: Philippos Pantelis, Ipswich, England

[73] Assignee: British Telecommunications, London, England

[21] Appl. No.: 475,377

[22] Filed: Mar. 14, 1983

[30] Foreign Application Priority Data

Mar. 18, 1982 [GB] United Kingdom ............... 8207921

[51] Int. Cl.[4] ............................................. B29D 7/24
[52] U.S. Cl. ..................................... 264/22; 264/104; 264/9; 156/244.17; 156/380; 156/496; 427/100
[58] Field of Search ................. 310/800; 264/22, 104; 427/12, 32, 100; 156/244.17, 380, 496

[56] References Cited

U.S. PATENT DOCUMENTS

| | | |
|---|---|---|
| 3,903,733 | 9/1975 | Murayama et al. ............... 310/800 |
| 3,985,814 | 10/1976 | Sasaki et al. ......................... 427/12 |
| 4,056,742 | 11/1977 | Tibbetts ............................... 310/800 |
| 4,204,135 | 5/1980 | Murayama ......................... 310/800 |
| 4,241,128 | 12/1980 | Wang . | |
| 4,340,786 | 7/1982 | Tester ............................. 427/100 X |
| 4,427,609 | 1/1984 | Broussoux et al. ................ 264/22 |

FOREIGN PATENT DOCUMENTS

| | | |
|---|---|---|
| 018802 | 11/1980 | European Pat. Off. . |
| 2738220 | 3/1978 | Fed. Rep. of Germany ...... 310/800 |
| 52-21189 | 8/1977 | Japan ................................. 310/800 |
| 2060994 | 5/1981 | United Kingdom . |

OTHER PUBLICATIONS

Bloomfield et al, "Piezo- and Pyroelectricity in Poly(-Vinylidene Fluoride)", *Nav. Res. Rev.*, vol. 31, #5, May 1978, pp. 1-15.

*Primary Examiner*—Alexander S. Thomas
*Attorney, Agent, or Firm*—Cushman,Darby&Cushman

[57] ABSTRACT

Film with piezoelectric and pyroelectric properties is obtained by extruding PVDF, stretching the extrudate and applying a corona discharge, preferably at the place where stretching occurs. The PVDF may be homopolymer, but copolymers of at least 50 mole % of vinylidene fluoride with tetrafluoroethylene and/or trifluoroethylene may be used.

33 Claims, 2 Drawing Figures

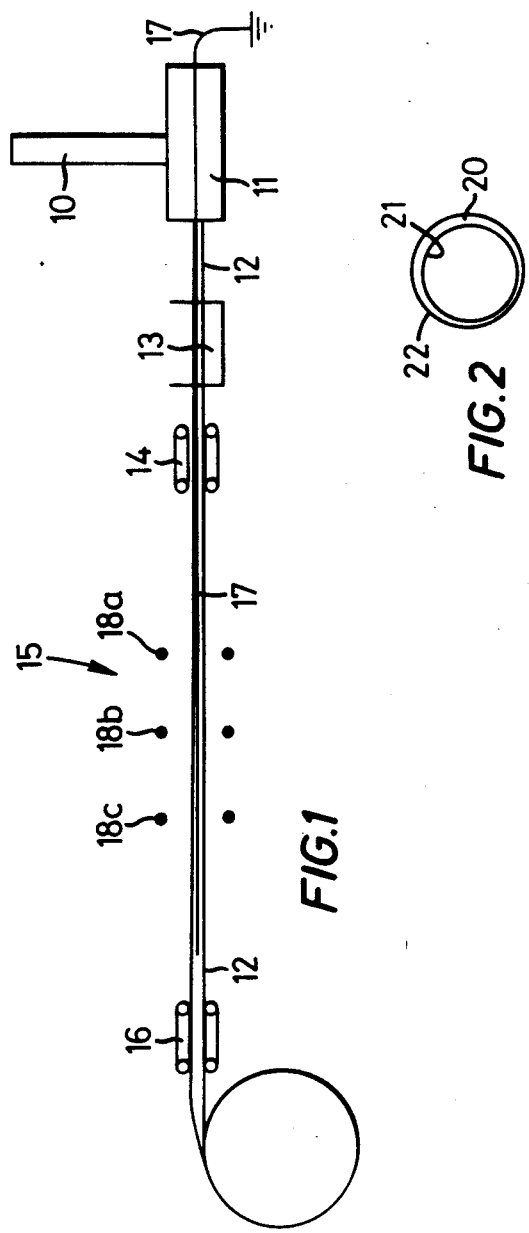

PIEZOELECTRIC AND PYROELECTRIC FILM

DESCRIPTION

This invention relates to piezoelectric and pyroelectric film and its preparation.

According to this invention a film having piezoelectric and pyroelectric properties is obtained by extruding a polymer containing at least 10 mole % of vinylidene fluoride units, preferably homopolymer (poly vinylidene fluoride), to form film, stretching the film and applying a transverse electric field of at least 50 volts per micrometer of thickness up to the maximum field which the film will withstand. The electric field may be applied before, during or after the stretching and, if desired, more than one field may be applied. Preferably the film is in the form of a tube.

Hereinafter poly (vinylidene fluoride) will be abbreviated to PVDF.

The formation of the film is conveniently carried out using a conventional extruder, eg a cross-head extruder in the case of a tube. The stretching may be carried out at temperatures from ambient up to the crystalline melting point of the polymer. When temperatures above ambient are used the extrudate is conveniently heated, eg by radiant heat, by hot air or in an oven. The stretching is preferably carried out by a slow haul-off followed by a fast haul-off running three to six times faster than the slow haul-off. There is often some slippage at the fast haul-off so the effective stretch ratio is often lower than the speed ratio, eg, if the speed ratio (fast:slow) is 6:1 the stretch ratio (after:before) may only be 4:1. It is believed that the optimum stretch ratio is between 4:1 and 5:1.

As already stated the minimum transverse electric field is 50 volts per micrometer of thickness and the maximum is provided by the strength of field which would cause sparking and puncture of the film. The strength of field required is dependent on drawing temperature, eg, at a higher temperature the same field may give an enhanced result. Suitable voltages are between 5 kilovolts and 150 kilovolts depending on the thickness of the wall of the tube. This part of the process is known as poling. In the case of a tube the field is conveniently applied between a conductor situated in the bore of the tube and a corona discharge unit surrounding the tube. The conductor in the bore is conveniently earthed and the corona discharge unit is connected to a high constant potential (either positive or negative).

The invention also includes tubes made as described above.

Films according to the invention are suitable for use as piezoelectric and pyroelectric detectors and suitable applications include probes for ultrasonic scanners, e.g. medical scanners; infra-red sensing elements; strain and deformation gauges; pressure sensitive devices, eg, traffic counters, touch and wave sensitive switches; seismic detectors; weighing devices.

The invention also includes film according to the invention having conductors in contact with either or both surfaces. Suitable solid conductors include metals and non-metallic conductors such as conductive paints, conductive polymers, conductive adhesives and carbon. Metals may be deposited on the surface by such methods as vacuum evaporation, sputtering, electroless plating, ion plating or in the form of conducting paints, dispersions or adhesives. Liquid conductors, e.g. mercury and aqueous electrolytes, are also applicable, especially in the bore of a tube according to the invention. In the case of tubes a metallic wire in the bore is particularly convenient for one electrode. The wire may be introduced after poling or, more conveniently, the poling electrode may be left in the bore using a process similar to wire coating.

The invention will now be described by way of example with reference to the accompanying drawings in which:

FIG. 1 illustrates an extrusion line for performing a process according to the invention, and FIG. 2 illustrates a tube according to the invention suitable for use as a piezoelectric detector.

As shown in FIG. 1 an extruder 10 melts granular PVDF and passes it through an annular cross-head die 11 to produce a tube 12 which is cooled in a water bath 13. The cooled tube passes through a slow haul-off 14, a heated zone 15 (where orientation and neck-down occur) and a fast haul-off 16 which runs three to six times faster than the slow haul-off 14. The tube contains a conductor 17 which passes through the cross-head die 11 to an earth connection. The tube also passes through a corona discharge ring 18a connected to 5–150 kV and alternatively sited at position 18a before neck-down; at position 18b at neck-down or at position 18c after neck-down. The conductor 17 may be a mandrel so that the tube slides off resulting in an empty core or the conductor 17 may move with lithe so that the conductor 17 remains in the bore to act as an electrode.

The corona discharge ring was a circle of tungsten wire. The circle had a radius of 1.25 cm and the wire had a diameter of 0.1 mm.

Using this invention, it is possible to obtain film having piezoelectric properties where the film is at least 50 mole % of vinylidene fluoride units, a thickness between 100 micrometers and 1000 micrometers, a length of at least 1 meter and a hydrostatic piezoelectric coefficient of at least 10 picocoulombs per newton (pC/N). Typically the hydrostatic piezoelectric coefficient is between 10 and 30 pC/N and the film width is about 10 cm as may be obtained from a tubular film having an outer diameter of about 3 cm.

Five samples of tubes were prepared by the method described above. Measurements on the tubes are given in Table 1. Columns A and B are for comparative illustration only, because the voltage/thickness ratio is below 50 V/micrometer. Columns 1, 2 and 3 are examples of the invention.

The invention has been exemplified by the use of homopolymer PVDF. Other vinylidene fluoride polymers which can be used in the invention include copolymers of vinylidene fluoride with tetrafluorethylene and/or trifluorethylene.

The stretching converts the crystalline regions of the polymer from crystal II into crystal form I and the poling modifies the crystal moiety to an assymetric arrangement. Mechanical stressing or a change of temperature alters the charge distribution giving rise to the external effects known as "piezoelectricity" and "pyroelectricity".

TABLE 1

|  |  | A | B | 1 | 2 | 3 |
|---|---|---|---|---|---|---|
| Dimensions of Tube |  |  |  |  |  |  |
| Outer Diameter | μm | 1390 | 1357 | 1390 | 1383 | 1409 |
| Inner Diameter | μm | 815 | 820 | 815 | 789 | 941 |
| Wall Thickness | μm | 290 | 269 | 290 | 297 | 234 |

TABLE 1-continued

|  |  | A | B | 1 | 2 | 3 |
|---|---|---|---|---|---|---|
| Draw Ratios | | | | | | |
| Machine | x:1 | 6 | 5.3 | 6 | 5.3 | 6 |
| Effective | y:1 | 4 | 3.8 | 4 | 3.5 | 4.1 |
| Corona Poling Voltage | | | | | | |
| At Neck | −4 V KV | — | 12 | — | 30 | 25 |
| After Neck | −4 V KV | — | — | 30 | — | — |
| Voltage/Thickness | V/μm | 0 | 45 | 104 | 101 | 107 |
| Speed of Tube | m/min | 1.9 | 2.6 | 1.9 | 2.6 | 3.0 |
| Coefficients | | | | | | |
| Piezoelectric voltage | $10^{-3}$ Vm/N | 0.12 | 2.1 | 49 | 100 | 140 |
| Piezoelectric charge | (pC/N) | 19 | 19 | 19 | 19 | 13 |
| Hydrostatic pyroelectric | (pC/N) ($\mu C/m^2/K$) | 14 | 14 | 14 | 25 | 29 |

TEST METHODS

The parameters quoted in the table were obtained as follows:

Sample Preparation

The inner electrode was applied by running diluted conductive silver paint into the tube and contact to this electrode was made by a fine copper wire pushed into the central hole. The outer electrode consisted of a band of silver paint 8.9 mm long in the central portion of a tube about 40 mm long. No guard ring electrodes were used.

A cross section through such a sample is shown in FIG. 2. A tube with PVDF wall 20 has an electrode 21 in contact with its inner wall and an outer electrode 22 in contact with its outer wall.

Piezoelectric Voltage Coefficient

This coefficient expresses the voltage produced by forces applied to the sample.

The piezoelectric voltage coefficient was measured by vibrating the tubes at 20 Hz under ambient conditions using a Bruel and Kjaer mini-shaker Type 4810 and monitoring both the voltage across the tube walls and the force applied to the tube. The force was measured by a Kistler 9203 quartz force transducer mounted in-line with the tube and feeding a Kistler 5001 charge amplifier. The tube voltage was measured using an Ancom 15A31 high impedance op-amp coupled with a Bryans Southern Instruments Transcribe 10 double transient signal recorder.

The coefficient was calculated by dividing the measured voltage by the force producing it and multiplying by a shape factor. The units are millivolts meters per newton.

The Piezoelectric Charge Coefficient

This coefficient expresses the surface charge density produced by forces applied to the sample.

The charge coefficient was measured and calculated in a similar manner to the voltage coefficient except that the charge developed was measured using a Kistler 5001 charge amplifier. The units are picocoulombs per newton.

TEST METHODS

Pyroelectric Coefficient

This coefficient expresses the surface charge density produced for unit change of temperature.

The temperature of the sample was changed in a sinuosoidal fashion at 20 mHz (ie, one cycle in 50 secs) by blowing nitrogen gas over the tube. The amplitude of the oscillation was 1 degree about a mean temperature of 20° C. The charge generated was collected by a Keithley electrometer operating in the 'fast feedback' mode with a 10 nF capacitor in the feedback. The ratio of the electrometer output to the thermocouple output was measured using a Solartron 1172 frequency response analyser. This ratio is the charge divided by the temperature change which produced it. Multiplying this quotient by a shape factor gives the pyroelectric coefficient. The units are microcoulombs per square meter per kelvin.

Hydrostatic Coefficient

This coefficient expresses the surface charge density produced by changes in ambient pressure.

The sample which was used for the pyroelectric measurement was suspended from the electrode wires in a pressure vessel containing silicone oil. The output from the sample was measured, as before, using a Keithley electrometer but in this experiment the pressure was changed in a 'square step' fashion and the sample was subjected to six steps of magnitudes 0–500 psi at one minute intervals. Each step lasted for ten seconds and an increase of about ten percent was noted in the charge generated between one and ten seconds. This is attributable to a cooling of the oil and sample after the adiabatic heating which occurs on pressurisation since the pyroelectric response diminishes the charge generated by the piezoelectric response.

To allow for the pyroelectric effect, the oil temperature was measured and the charge related to the change of temperature was calculated using the pyroelectric coefficient as found by the previous experiment. The calculated charge was added to the measured charge to give the charge attributable to the change of pressure. The coefficient was found by dividing the charge by the pressure causing it and multiplying by a shape factor. The units are picocoulombs per newton.

I claim:

1. A method of extruding and simultaneously treating a PVDF-containing film to enhance its piezoelectric/pyroelectric properties, said method comprising the ongoing simultaneous yet successive steps of:
   extruding a tube of polymer containing at least 50 mole % of PVDF;
   maintaining a center electrode means within said tube as it is being extruded;
   stretching said tube by applying tensile forces therealong, said tensile forces being applied between first and second haul-off means operating at different speeds spaced apart along the downstream path of the tube as it is being extruded; and
   applying a poling electrostatic field transversely across the circumferential walls of said tube between an external ring electrode and said center electrode means.

2. A method as in claim 1 wherein supplemental external heat is applied to said tube during said stretching step.

3. A method as in claim 1 wherein said applying step occurs at a predetermined location between said first and second haul-off means.

4. A method as in claim 3 wherein said applying step occurs at a position before substantial neck-down of the tube has occurred during said stretching step.

5. A method as in claim 3 wherein said applying step occurs at a position where substantial neck-down of the tube occurs during said stretching step.

6. A method as in claim 3 wherein said applying step occurs at a position after substantial neck-down of the tube has occurred during said stretching step.

7. A piezoelectric/pyroelectric PVDF-containing film produced in accordance with the process of claim 6.

8. Apparatus for extruding and simultaneously treating a PVDF film to enhance its piezoelectric/pyroelectric properties, said apparatus comprising:
   extruder means for extruding tube of polymer containing at least 50 mole % of PVDF;
   internal electrode means disposed so as to be within said tube as it is being extruded;
   first and second spaced apart haul-off means for stretching said tube by applying tensile forces therealong at spaced apart locations along the downstream path of the tube as it is being extruded and moved between said haul-off means; and
   external ring electrode means for applying a poling electrostatic field transversely across the walls of said tube between said external ring electrode means and said internal electrode means.

9. Apparatus as in claim 8 wherein said external ring electrode means is disposed at a predetermined location between said first and second haul-off means.

10. Apparatus as in claim 9 wherein said external ring electrode means is disposed at a position where substantial neckdown of the tube occurs.

11. Apparatus as in claim 9 wherein said external ring electrode means is disposed at a position after substantial neck-down of the tube has occurred.

12. Apparatus as in claim 8 wherein said external ring electrode means is disposed at a position before substantial neck-down of the tube has occurred.

13. A method of extruding and simultaneously treating a PVDF-containing film to enhance its piezoelectric/pyroelectric properties, said method comprising the ongoing simultaneous yet successive steps of:
   extruding a polymer film containing at least 50 mole % of PVDF;
   maintaining first and second electrode means on opposite sides of said film downstream of said extruding step;
   stretching said film by applying tensile forces therealong, said tensile forces being applied between first and second haul-off means operating at different speeds spaced apart along the downstream path of the film as it is being extruded; and
   applying a transverse poling electrostatic field across said film between said first and second electrodes as the extruding film passes thereby.

14. A method as in claim 13 further comprising the step of applying heat to said film during said stretching step.

15. A method as in claim 13 wherein said applying step occurs at a location between said first and second haul-off means.

16. A piezoelectric/pyroelectric PVDF-containing film produced in accordance with the process of claim 13.

17. Apparatus for extruding and simultaneously treating a PVDF-containing film to enhance its piezoelectric/pyroelectric properties, said apparatus comprising:
   extruder means for extruding a polymer film containing at least 50 mole % polyvinylidene fluoride;
   first and second electrodes disposed so as to be on opposite sides of said film as it is being extruded at a location downstream of said extruder means;
   first and second spaced-apart haul-off means disposed downstream of said extruder means for stretching said extruding film therebetween as it is being moved between said haul-off means; and
   electrostatic poling means connected to said first and second electrodes for applying a transverse poling electrostatic field across said film as said extruding film passes thereby;
   wherein said first and second electrode means are disposed between said first and second haul-off means.

18. A method of making film by extrusion and simultaneously processing the extrudate to enhance its piezoelectric and/or pyroelectric properties during the extrusion process, which method comprises the steps of:
   extruding a polymer containing at least 50 mole % of vinylidene fluoride units to form an extruded film,
   stretching said extruded film,
   subjecting said extruded film to corona discharge treatment by applying a transverse electric field of at least 10 volts per micrometer of thickness up to the maximum field which the extruded film will withstand to form said film with said properties; and
   feeding said extruded film to said stretching step from said extruding step without interruption or breakage of said film,
   wherein said extruded film is extruded in the form of a tube.

19. A method as in claim 18 further characterized by the extruded tubular film being extruded as a jacket around a conductor while employing the conductor as an electrode in the corona discharge treatment.

20. A method as in claim 19 further including the step of providing a continuous conductor movable with the tubular film to provide an electrically conducting core for the film with said properties.

21. A film made by the method of claim 18, 19 or 20 having piezoelectric properties, said film being formed of a polymer containing at least 50 % mole % of vinylidene fluoride units, and formed to have a thickness between 100 micrometers and 1000 micrometers, a length of at least 1 meter and a hydrostatic piezoelectric coefficient of at least 10 pC/N, said film being in the form of a tube.

22. A film as in claim 21 wherein the tube has an outer diameter of not more than 3 centimeters.

23. A film as in claim 21 wherein an electrode is in contact with at least one surface of said film.

24. A method as in claim 18 wherein said corona discharge treatment uses a field strength of between 30 and 150 volts per micrometer of thickness.

25. A method according to claim 18 wherein said corona discharge treatment comprises applying a voltage of between 5 kilovolts to 10 kilovolts across said extruded film.

26. A method as in claim 18 wherein said polymer is a copolymer of vinylidene fluoride with at least one of: (a) tetrafluoroethylene and (b) trifluoroethylene.

27. A method as in claim 18 wherein said polymer is a homopolymer of vinylidene fluoride.

28. A method as in claim 18 wherein said step of stretching said extruded film includes passing said film through a slow haul-off and then through a fast haul-off which runs 3 to 6 times faster than said slow haul-off, said extruded film being heated to a temperature not exceeding its crystalline melting point between the slow and fast haul-offs.

29. A method as in claim 28 wherein the corona discharge treatment is applied to the heated portion of the extruded film.

30. A method as in claim 29 wherein the corona discharge treatment is applied to a stretched region of the film between the fast and slow haul-offs.

31. A film with piezoelectric and/or pyroelectric properties made by a method according to claim 18, 19, 20, 28, 29 or 30 wherein conductors which are suitable for use as an electrode are in contact with at least one surface of said film.

32. Apparatus for making film by extrusion and simultaneously processing the extrudate to enhance its piezoelectric and/or pyroelectric properties during the extrusion process by extruding a polymer containing at least 50 mole % of vinylidene fluoride units to form an extruded film, stretching the immediately extruded film, subjecting the extruded film to corona discharge treatment by applying a transverse electric field of at least 10 volts per micrometer of thickness up to the maximum field which the extruded film will withstand to form said film with said properties, and feeding the extruded film to said stretching step from said extruding step without interruption of the film, said apparatus comprising:

an extruder (11) for extruding poly vinylidene fluoride film (12), a slow haul-off (14) for receiving said extruded film immediately after extrusion of said film without interruption or breakage of said film, a fast haul-off (16) disposed in line with said slow haul-off to orient said extruded film in a machine direction of film extrusion, and poling means (15) disposed between said slow and fast haul-offs for applying a poling voltage to said extruded film.

33. Apparatus as in claim 32 wherein said extruder comprises a cross-head extruder means for producing said film in the form of a tube.

* * * * *